United States Patent
Koch et al.

(10) Patent No.: US 7,786,019 B2
(45) Date of Patent: Aug. 31, 2010

(54) MULTI-STEP PHOTOMASK ETCHING WITH CHLORINE FOR UNIFORMITY CONTROL

(75) Inventors: Renee Koch, Brentwood, CA (US); Scott A. Anderson, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 68 days.

(21) Appl. No.: 11/612,036

(22) Filed: Dec. 18, 2006

(65) Prior Publication Data

US 2008/0142476 A1  Jun. 19, 2008

(51) Int. Cl.
*H01L 21/302* (2006.01)

(52) U.S. Cl. .................. 438/723; 438/706; 438/713; 438/725; 430/317

(58) Field of Classification Search ............. 438/706, 438/710, 712, 714, 720, 723, 736; 216/67, 216/79; 430/316, 317
See application file for complete search history.

(56) References Cited

U.S. PATENT DOCUMENTS

| | | |
|---|---|---|
| 4,263,088 A | 4/1981 | Gorin |
| 4,357,195 A | 11/1982 | Gorin |
| 4,579,623 A | 4/1986 | Suzuki et al. |
| 4,784,720 A | 11/1988 | Douglas |
| 4,790,903 A | 12/1988 | Sugano et al. |
| 4,855,017 A | 8/1989 | Douglas |
| 4,863,549 A | 9/1989 | Grunwald |
| 4,889,588 A | 12/1989 | Fior |
| 4,891,118 A | 1/1990 | Ooiwa et al. |
| 5,087,857 A | 2/1992 | Ahn |
| 5,160,408 A | 11/1992 | Long |
| 5,302,241 A | 4/1994 | Cathey, Jr. |
| 5,322,590 A | 6/1994 | Koshimizu |
| 5,352,324 A | 10/1994 | Gotoh et al. |
| 5,356,515 A | 10/1994 | Tahara et al. |
| 5,362,358 A | 11/1994 | Yamagata et al. |
| 5,468,341 A | 11/1995 | Samukawa |
| 5,474,864 A | 12/1995 | Isao et al. |
| 5,482,799 A | 1/1996 | Isao et al. |

(Continued)

FOREIGN PATENT DOCUMENTS

DE    36 13 181    10/1987

(Continued)

OTHER PUBLICATIONS

European Search Report dated May 27, 2008 for European Application No. 07122837.3-1226.

(Continued)

*Primary Examiner*—Lan Vinh
(74) *Attorney, Agent, or Firm*—Moser IP Law Group

(57) ABSTRACT

Methods for etching quartz are provided herein. In one embodiment, a method of etching quartz includes providing a film stack on a substrate support disposed in a processing chamber, the film stack having a quartz layer partially exposed through a patterned layer; and etching the quartz layer of the film stack in a multi-step process including a first step of etching the quartz layer utilizing a first process gas comprising at least one fluorocarbon process gas and a chlorine-containing process gas; and a second step of etching the quartz layer utilizing a second process gas comprising at least one fluorocarbon process gas.

29 Claims, 5 Drawing Sheets

U.S. PATENT DOCUMENTS

| | | | |
|---|---|---|---|
| 5,605,776 A | 2/1997 | Isao et al. | |
| 5,614,060 A | 3/1997 | Hanawa | |
| 5,629,114 A | 5/1997 | Isao et al. | |
| 5,674,647 A | 10/1997 | Isao et al. | |
| 5,683,538 A | 11/1997 | O'Neill et al. | |
| 5,691,090 A | 11/1997 | Isao et al. | |
| 5,705,081 A | 1/1998 | Inazawa et al. | |
| 5,830,607 A | 11/1998 | Isao et al. | |
| 5,938,897 A | 8/1999 | Isao et al. | |
| 5,952,128 A | 9/1999 | Isao et al. | |
| 6,022,460 A | 2/2000 | O et al. | |
| 6,193,855 B1 | 2/2001 | Gopalraja et al. | |
| 6,228,541 B1 | 5/2001 | Isao et al. | |
| 6,284,148 B1 | 9/2001 | Laermer et al. | |
| 6,391,791 B1 | 5/2002 | Sasaki et al. | |
| 6,569,577 B1 | 5/2003 | Isao et al. | |
| 6,605,543 B1 * | 8/2003 | Zheng | 438/710 |
| 6,635,185 B2 * | 10/2003 | Demmin et al. | 216/64 |
| 6,635,566 B1 * | 10/2003 | Blosse et al. | 438/638 |
| 6,689,515 B2 | 2/2004 | Yoshioka et al. | |
| 6,716,758 B1 | 4/2004 | Donohue | |
| 2004/0082186 A1 * | 4/2004 | Okamoto | 438/709 |
| 2004/0124177 A1 * | 7/2004 | Urban et al. | 216/67 |
| 2004/0132311 A1 | 7/2004 | Nallan et al. | |
| 2004/0203177 A1 | 10/2004 | Davis et al. | |
| 2005/0154151 A1 * | 7/2005 | Durairaj et al. | 525/474 |
| 2005/0164514 A1 * | 7/2005 | Rauf et al. | 438/710 |
| 2006/0154151 A1 | 7/2006 | Anderson et al. | |
| 2006/0163203 A1 | 7/2006 | Buie et al. | |
| 2006/0166107 A1 | 7/2006 | Chen et al. | |

FOREIGN PATENT DOCUMENTS

| | | |
|---|---|---|
| DE | 39 40 083 A1 | 6/1991 |
| DE | 42 02 447 | 7/1992 |
| DE | 42 04 848 | 8/1992 |
| EP | 0 200 951 A2 | 12/1986 |
| EP | 0 363 982 A2 | 4/1990 |
| EP | 0 383 570 A2 | 8/1990 |
| EP | 0 497 023 A1 | 8/1992 |
| EP | 0 710 977 A1 | 5/1996 |
| EP | 0 734 046 A2 | 9/1996 |
| EP | 1 420 438 A2 | 5/2004 |
| EP | 1 686 422 A2 | 8/2006 |
| JP | 59-47733 | 3/1984 |
| JP | 60-50923 | 3/1985 |
| JP | 60-62125 | 4/1985 |
| JP | 61-1023 | 1/1986 |
| JP | 61-263125 | 11/1986 |
| JP | 63-013334 | 1/1988 |
| JP | 63-115338 | 5/1988 |
| JP | 2-14523 | 1/1990 |
| JP | 2-156529 | 6/1990 |
| JP | 2-312229 | 12/1990 |
| JP | 03-129820 | 6/1991 |
| JP | 6-181185 | 6/1994 |
| JP | 6-342769 | 12/1994 |
| JP | 7-142453 | 6/1995 |
| JP | 10079372 | 3/1998 |
| WO | 88/09830 A1 | 12/1988 |
| WO | 01/96955 A2 | 12/2001 |

OTHER PUBLICATIONS

Kim, Hyoung-Do et al., "Application of a multi-step quartz etching method to strong PSMs," Proceedings of the SPIE—The International Society for Optical Engineering SPIE-Int. Soc. Opt. Eng USA, vol. 4409, 2001, pp. 118-124, XP002476133.

* cited by examiner

MULTI-STEP PHOTOMASK ETCHING WITH CHLORINE FOR UNIFORMITY CONTROL

BACKGROUND OF THE INVENTION

1. Field of the Invention

Embodiments of the present invention generally relate to a method for plasma etching quartz and, more specifically, to a method for etching quartz photomasks utilizing a multi-step etching process.

2. Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask is typically a glass or a quartz substrate that has a layer of chromium on one side. The mask may also contain a layer of silicon nitride (SiN) doped with molybdenum (Mb). The chromium layer is covered with an anti-reflective coating and a photosensitive resist. During a patterning process, the circuit design is written onto the mask by exposing portions of the resist to ultraviolet light, making the exposed portions soluble in a developing solution. The soluble portion of the resist is then removed, allowing the exposed underlying chromium to be etched. The etch process removes the chromium and anti-reflective layers from the mask at locations where the resist was removed, i.e., the exposed chromium is removed.

Another mask utilized for patterning is known as a quartz phase shift mask. The quartz phase shift mask is similar to the mask described above, except that alternating adjacent areas of quartz regions exposed through the patterned chromium layer are etched to a depth about equal to half the wavelength of light which will be utilized to transfer the circuit patterns to a substrate during fabrication. Thus, as the light is shown through the quartz phase shift mask to expose resist disposed on the wafer substrate, the light impinging in the resist through one opening in the mask is 180 degrees out of phase relative to the light passing through the immediately adjacent opening. Therefore, light that may be scattered at the edges of the mask opening is cancelled out by the 180 degree light scattering at the edge of the adjacent opening, causing a tighter distribution of light in. a predefined region of the resist. The tighter distribution of light facilitates writing of features having smaller critical dimensions. Similarly, masks used for chromeless etch lithography also utilize the phase shift of light passing through quartz portions of two masks to sequentially image the resist, thereby improving the light distribution utilized to develop the resist pattern.

In one etch process, known as dry etching, reactive ion etching (RIE), or plasma etching, a plasma is used to enhance a chemical reaction and etch the exposed quartz area of the mask. Undesirably, conventional quartz etch processes often exhibit RIE lag between features having different critical dimensions. For example, the vertical etch rates of features having large widths is different than the vertical etch rates of features having smaller widths. Other attributes of conventional quartz etch processes, such as sidewall angle of the trench etched in the quartz layer and microtrenching, have not demonstrated acceptable results for masks having critical dimensions less than about 5 µm. This results in non-uniformity of the etched features of the mask and correspondingly diminishes the ability to produce features having small critical dimensions using the mask.

As the critical dimensions of mask continue to shrink, the importance of etch uniformity increases. Thus, a quartz etch process having high etch uniformity and low RIE lag is highly desirable.

Thus, there is a need for an improved quartz etch process.

SUMMARY OF THE INVENTION

Methods for etching quartz are provided herein. In one embodiment, a method of etching quartz includes providing a film stack on a substrate support disposed in a processing chamber, the film stack having a quartz layer partially exposed through a patterned layer; and etching the quartz layer of the film stack in a multi-step process including a first step of etching the quartz layer utilizing a first process gas comprising at least one fluorocarbon process gas and a chlorine-containing process gas; and a second step of etching the quartz layer utilizing a second process gas comprising at least one fluorocarbon process gas.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Figure 1:
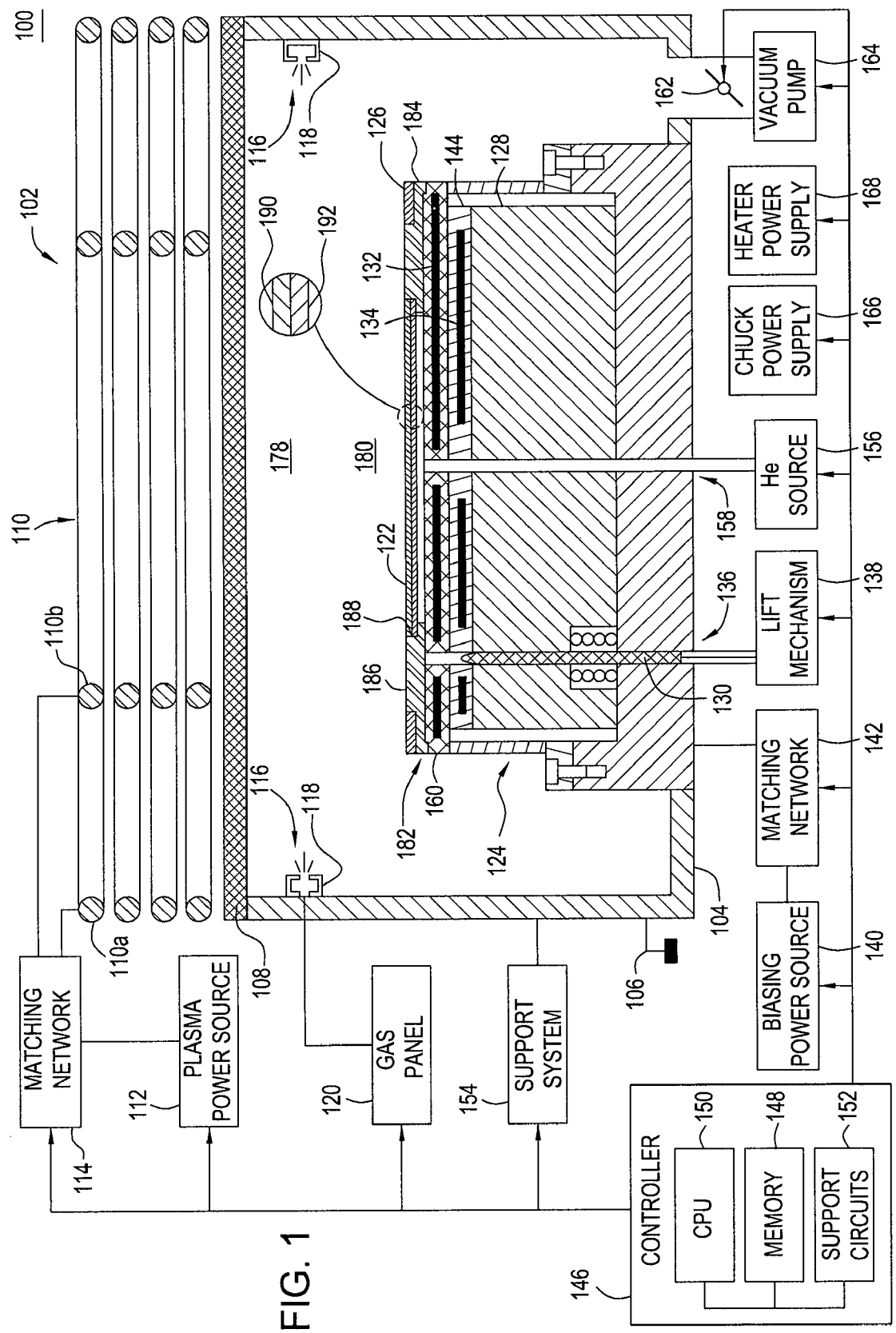
FIG. 1 is a schematic diagram of an etch reactor suitable for etching quartz.

FIG. 1 depicts a schematic diagram of one embodiment of an etch reactor 100 in which a method of quartz etching of the present invention may be practiced. Suitable reactors that may be adapted for use with the teachings disclosed herein include, for example, the Decoupled Plasma Source (DPS®) II reactor, or the TETRA™ I and TETRA™ II Photomask etch systems, all of which are available from Applied Materials, Inc. of Santa Clara, Calif. The DPS® II reactor may also be used as a processing module of a CENTURA® integrated semiconductor wafer processing system, also available from Applied Materials, Inc. The particular embodiment of the reactor 100 shown herein is provided for illustrative purposes and should not be used to limit the scope of the invention.

The reactor 100 generally comprises a process chamber 102 having a substrate pedestal 124 within a conductive body (wall) 104, and a controller 146. The chamber 102 has a substantially flat dielectric ceiling 108. Other modifications of the chamber 102 may have other types of ceilings, e.g., a dome-shaped ceiling. An antenna 110 is disposed above the ceiling 108. The antenna 110 comprises one or more inductive coil elements that may be selectively controlled (two co-axial elements 110a and 110b are shown in FIG. 1). The antenna 110 is coupled through a first matching network 114 to a plasma power source 112. The plasma power source 112 is typically capable of producing a radio frequency (RF) signal of up to about 3000 Watts (W) at a tunable frequency in a range from about 2 MHz to about 200 MHz, for example, 13.56 MHz. In one embodiment, the plasma power source 112 provides about 300 to about 600 W of inductively coupled RF power.

The substrate pedestal (cathode) 124 is coupled through a second matching network 142 to a biasing power source 140. The biasing source 140 provides an RF signal of between about zero to about 600 W at a tunable frequency in a range from about 2 MHz to about 200 MHz, for example, 13.56 MHz. The biasing source 140 may be configured to provide a continuous wave output or a pulsed output having a tunable pulse frequency in the range of from about 1 to about 10 kHz. Alternatively, the biasing source 140 may produce pulsed DC power output.

In one embodiment, the biasing source 140 is configured to provide RF power less than about 600 Watts at a frequency between about 1 to about 10 kHz, with a duty cycle between about 10 to about 95 percent. In another embodiment, the biasing source 140 is configured to provide RF power between about 20 to about 150 Watts, at a frequency between about 2 to about 5 kHz, with a duty cycle between about 80 to about 95 percent.

In one embodiment as in a DPS® II reactor, the substrate support pedestal 124 may include an electrostatic chuck 160. The electrostatic chuck 160 comprises at least one clamping electrode 132 and is controlled by a chuck power supply 166. In alternative embodiments, the substrate pedestal 124 may comprise substrate retention mechanisms such as a susceptor clamp ring, a mechanical chuck, and the like.

A gas panel 120 is coupled to the process chamber 102 to provide process and/or other gases to the interior of the process chamber 102. In the embodiment depicted in FIG. 1, the gas panel 120 is coupled to one or more inlets 116 formed in a channel 118 in the sidewall 104 of the chamber 102. It is contemplated that the one or more inlets 116 may be provided in other locations, for example, in the ceiling 108 of the process chamber 102.

In one embodiment, the gas panel 120 is adapted to selectively provide one or more process gases through the inlets 116 and into the interior of the process chamber 102 during processing. For example, in one embodiment, the gas panel 120 may be adapted to selectively provide a fluorine-containing and/or a chlorine-containing process gas (or gases) into the interior of the process chamber 102, as described below in connection with methods of etching a photomask. During processing, a plasma is formed from the gas and maintained through inductive coupling of power from the plasma power source 112. The plasma may alternatively be formed remotely or ignited by other methods.

The pressure in the chamber 102 is controlled using a throttle valve 162 and a vacuum pump 164. The vacuum pump 164 and throttle valve 162 are capable of maintaining chamber pressures in the range of about 1 to about 20 mTorr.

The temperature of the wall 104 may be controlled using liquid-containing conduits (not shown) that run through the wall 104. Wall temperature is generally maintained at about 65 degrees Celsius. Typically, the chamber wall 104 is formed from a metal (e.g., aluminum, stainless steel, and the like) and is coupled to an electrical ground 106. The process chamber 102 also comprises conventional systems for process control, internal diagnostic, end point detection, and the like. Such systems are collectively shown as support systems 154.

A reticle adapter 182 is used to secure a substrate (such as a reticle or other workpiece) 122 onto the substrate support pedestal 124. The reticle adapter 182 generally includes a lower portion 184 milled to cover an upper surface of the pedestal 124 (for example, the electrostatic chuck 160) and a top portion 186 having an opening 188 that is sized and shaped to hold the substrate 122. The opening 188 is generally substantially centered with respect to the pedestal 124. The adapter 182 is generally formed from a single piece of etch resistant, high temperature resistant material such as polyimide ceramic or quartz. A suitable reticle adapter is disclosed in U.S. Pat. No. 6,251,217, issued on Jun. 26, 2001, and incorporated herein by reference. An edge ring 126 may cover and/or secure the adapter 182 to the pedestal 124.

A lift mechanism 138 is used to lower or raise the adapter 182, and hence, the substrate 122, onto or off of the substrate support pedestal 124. Generally, the lift mechanism 138 comprises a plurality of lift pins (one lift pin 130 is shown) that travel through respective guide holes 136.

In operation, the temperature of the substrate 122 is controlled by stabilizing the temperature of the substrate pedestal 124. In one embodiment, the substrate support pedestal 124 comprises a heater 144 and an optional heat sink 128. The heater 144 may be one or more fluid conduits configured to flow a heat transfer fluid therethrough. In another embodiment, the heater 144 may include at least one heating element 134 that is regulated by a heater power supply 168. Optionally, a backside gas (e.g., helium (He)) from a gas source 156 is provided via a gas conduit 158 to channels that are formed in the pedestal surface under the substrate 122. The backside gas is used to facilitate heat transfer between the pedestal 124 and the substrate 122. During processing, the pedestal 124 may be heated by the embedded heater 144 to a steady-state temperature, which in combination with the helium backside gas, facilitates uniform heating of the substrate 122.

The controller 146 comprises a central processing unit (CPU) 150, a memory 148, and support circuits 152 for the CPU 150 and facilitates control of the components of the process chamber 102 and, as such, of the etch process, as discussed below in further detail. The controller 146 may be one of any form of general-purpose computer processor that can be used in an industrial setting for controlling various chambers and sub-processors. The memory 148 of the CPU 150 may be one or more of readily available memory such as random access memory (RAM), read only memory (ROM), floppy disk, hard disk, or any other form of digital storage, local or remote. The support circuits 152 are coupled to the CPU 150 for supporting the processor in a conventional manner. These circuits include cache, power supplies, clock circuits, input/output circuitry and subsystems, and the like. The inventive method is generally stored in the memory 148 or other computer-readable medium accessible to the CPU 150 as a software routine. Alternatively, such software routine may also be stored and/or executed by a second CPU (not shown) that is remotely located from the hardware being controlled by the CPU 150.

Figure 2:
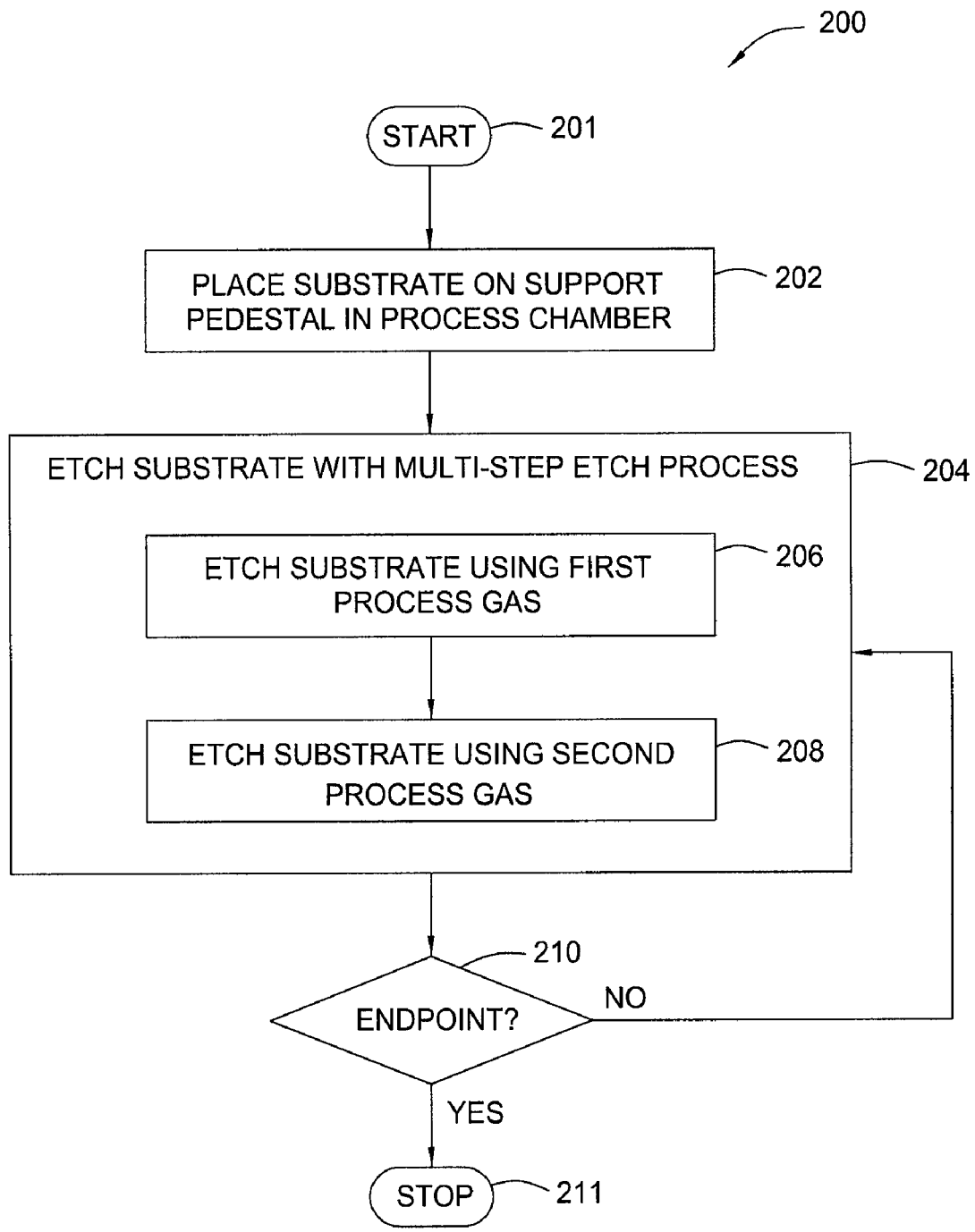
FIG. 2 is a flow diagram of one embodiment of a method for etching quartz.

FIG. 2 is a flow diagram of one embodiment of a method 200 for etching quartz. Although the method 200 is described below with reference to a substrate utilized to fabricate a photomask (as described above in FIG. 1), the method 200 may also be used in other quartz etching applications.

The method 200, which may be stored in computer readable form in the memory 148 of the controller 146 or other storage medium, begins at step 201 and proceeds to step 202. At step 202, the substrate 122 is placed on a support pedestal 124 in a process chamber. The process chamber may be a TETRA™ I, TETRA™ II, DPS® II, or other suitable etch chamber, as described above. In one embodiment, the substrate 122 rests in the opening 188 of the adapter 182. The substrate 122 depicted in FIG. 1 includes an optically transparent silicon based material, such as quartz (e.g., silicon dioxide, $SiO_2$ layer 192), having an opaque light-shielding layer of metal, known as a photomask material 190, forming a patterned mask on the surface of the quartz layer 192. It is contemplated that a separate mask may be utilized, or in other applications, a mask disposed on the quartz layer 192 may be comprised of different materials, and may include or be separated from the substrate by one or more intervening layers. Typical metals suitable for use as a photomask layer 190 include chromium and/or chromium oxynitride. The substrate 122 may also include a layer (not shown) of silicon nitride (SiN) doped with molybdenum (Mo) interposed between the quartz layer 192 and photomask layer 190.

Next, at step 204, the quartz layer 192 of the substrate 122 is etched using a multi-step etch process. The multi-step etch process comprises a first etch step 206, wherein the substrate is etched using a first process gas comprising one or more fluorocarbon gases and a chlorine-containing gas, and a second etch step 208, wherein the substrate is etched using a second process gas comprising one or more fluorine-containing gases. Steps 206 and 208 may be performed in either order. Moreover, one or more of steps 206 and 208 may be repeated as desired to continue the multi-step etch process until a desired endpoint is reached.

At step 206, a first process gas comprising one or more fluorocarbon gases and a chlorine-containing gas is introduced into the process chamber 102 through the gas inlet 116. The first process gas may further include an inert gas, such as helium (He), argon (Ar), xenon (Xe), neon (Ne), krypton (Kr), and the like.

Exemplary chlorine-containing gases may include chlorine ($C_{12}$), hydrogen chloride (HCl), and the like. In one embodiment, the chlorine-containing gas comprises chlorine ($Cl_2$). In one embodiment, $Cl_2$ is provided at a rate of between about 1-10 standard cubic centimeters per minute (sccm). In one embodiment, $Cl_2$ at a rate of about 5 sccm is used. The pressure in the process chamber is controlled to less than about 40 mTorr, and in one embodiment, between about 1 and about 10 mTorr, for example 2 mTorr.

Exemplary fluorocarbon gases may include $CF_4$, $CHF_3$, $C_2F$, $C_4F_6$, $C_4F_8$, and the like. In one embodiment, $CF_4$ is provided at a rate of between about 2-50 sccm and $CHF_3$ is provided at a rate of between about 2-50 sccm. In one embodiment, $CF_4$ at a rate of about 9 sccm, and $CHF_3$ at a rate of about 26 sccm are used. The pressure in the process chamber is controlled to less than about 40 mTorr, and in one embodiment, between about 1 and about 10 mTorr, for example 2 mTorr.

Optionally, at step 206, a substrate bias power is applied to the support pedestal 124 to bias the substrate 122. The bias power may be less than about 150 W, or in a first example, less than about 100 W, or in a second example, between 20 and about 150 W. In one embodiment, about 65 W of bias power is used for the process. The bias power may further be a 13.56 MHz RF signal provided at a continuous wave output or pulsed at a pulse frequency of between about 1-10 kHz, or in one embodiment, between about 2-5 kHz.

The bias power may be pulsed in a duty cycle of between about 10-95 percent, or in one embodiment, between about 20-95 percent. In one embodiment, the biasing source 140 is configured to provide less than about 150 Watts of RF power at a pulse frequency between about 1 to about 10 kHz, with a duty cycle between about 10 to about 95 percent. In another embodiment, the biasing source 140 is configured to provide between about 20 to about 150 Watts of RF power at a pulse frequency between about 2 to about 5 kHz, with a duty cycle between about 10 to about 95 percent.

In an embodiment wherein the quartz layer includes a layer of patterned photoresist thereover, the biasing source 140 may provide a pulsed RF power between about 20 to about 150 Watts, at a pulse frequency between about 2 to about 5 kHz, with a duty cycle between about 10 to about 90 percent. In an embodiment wherein the quartz layer does not have a layer of patterned photoresist thereover, the biasing source 140 may provide a pulsed RF power between about 20 to about 150 Watts, at a pulse frequency between about 2 to about 5 kHz, with a duty cycle between about 10 to about 50 percent.

Plasma is formed from the first process gas by applying RF power of between about 300 to about 600 W from the plasma power source 112 to the antenna 110. It is contemplated that the plasma may be ignited by other methods. In one embodiment, RF power of about 420 W is applied to the antenna 110 at a frequency of about 13.56 MHz. During step 206, the quartz layer 192 exposed on the substrate 122 is etched for a first period of time until a desired endpoint for step 206 is reached. The endpoint may be determined by time, optical interferometry or by other suitable methods.

Next, at step 208, a second process gas comprising one or more fluorocarbon gases are introduced into the process chamber 102 through the gas inlet 116. The second process gas may further include one or more inert gases, such as He, Ar, Xe, Ne, Kr, and the like.

Exemplary fluorocarbon gases may include $CF_4$, $CHF_3$, $C_2F$, $C_4F_6$, $C_4F_8$, and the like. In one embodiment, $CF_4$ is provided at a rate of between about 2-50 sccm and $CHF_3$ is provided at a rate of between about 2-50 sccm. In one embodiment, $CF_4$ at a rate of about 9 sccm, and $CHF_3$ at a rate of about 26 sccm are used. The pressure in the process chamber is controlled to less than about 40 mTorr, and in one embodiment, between about 1 and about 10 mTorr, for example 2 mTorr.

Optionally, at step 208, a substrate bias power is applied to the support pedestal 124 to bias the substrate 122. The bias power may be less than about 150 W, or in a first example, less than about 100 W, or in a second example, between about 20 and about 150 W. In one embodiment, about 65 W of bias power is used for the process. The bias power may further be an RF signal provided at a continuous wave output or pulsed at a pulse frequency of between about 1-10 kHz, or in one embodiment, between about 2-5 kHz.

The bias power may be pulsed in a duty cycle of between about 10-95 percent, or in one embodiment, between about 20-95 percent. In one embodiment, the biasing source 140 is configured to provide less than about 150 Watts of RF power at a pulse frequency between about 1 to about 10 kHz, with a duty cycle between about 10 to about 95 percent. In another embodiment, the biasing source 140 is configured to provide between about 20 to about 150 Watts of RF power at a pulse frequency between about 2 to about 5 kHz, with a duty cycle between about 10 to about 95 percent.

In an embodiment wherein the quartz layer includes a layer of patterned photoresist thereover, the biasing source 140 may provide a pulsed RF power between about 20 to about 150 Watts, at a pulse frequency between about 2 to about 5 kHz, with a duty cycle between about 10 to about 90 percent. In an embodiment wherein the quartz layer does not have a layer of patterned photoresist thereover, the biasing source 140 may provide a pulsed RF power between about 20 to about 150 Watts, at a pulse frequency between about 2 to about 5 kHz, with a duty cycle between about 10 to about 50 percent.

Plasma is formed from the second process gas by applying RF power of between about 300 to about 600 W from the plasma power source 112 to the antenna 110. As discussed above at step 206, it is contemplated that the plasma may be ignited by other methods. In one embodiment, RF power of about 420 W is applied to the antenna 110 at a frequency of about 13.56 MHz. During step 208, the quartz layer 192 exposed on the substrate 122 is etched for a second period of time until a desired endpoint for step 208 is reached.

At step 210, it is queried whether a desired endpoint for the multi-step etch process is reached. As noted above, the endpoint may be determined by time, optical interferometry, or by other suitable methods. Optionally, the substrate may be removed from the chamber to facilitate ex-situ etch depth measurement and returned to the chamber for additional processing if necessary. If the answer to the query at step 210 is yes, the process ends at step 211 and the substrate may continue with any further processing as necessary. If the answer is no, the method returns to step 204. For further iterations of step 204, it is contemplated that the multi-step process may end after only repeating one of steps 206 or 208 upon reaching the desired multi-step etch endpoint. It is further contemplated that the duration of steps 206 and/or 208 repeated during iterations of step 204 may be different than from prior iterations (e.g., the duration of any step 206 or 208 during any iteration may be longer, shorter, or the same as any other duration of any step 206 or 208 from any prior iteration).

The multi-step etching process as used in certain embodiments further provide uniformity control for the etched feature. In one embodiment, the above etch process utilized in step 206 provides a center-fast etch (i.e., the central portion of the substrate is etched at a faster rate than peripheral portions of the substrate), while the etch process utilized in step 208 provides a center-slow etch (i.e., the central portion of the substrate is etched at a slower rate than peripheral portions of the substrate). Accordingly, the method 200 advantageously combines the two steps into a multi-step etch process having greater uniformity and phase angle range as compared to conventional methods. The method 200 further advantageously provides for reduced RIE lag, microtrenching, and more vertical sidewall angle control as compared to conventional etch methods. Thus, the method 200 is highly desirable in small critical dimension applications. It is to be appreciated, as discussed above, that the inventive method can begin with either of step 206 or step 208 and can be repeated in any sequence to provide further control as needed until the desired endpoint is reached.

FIGS. 3A-G depict one embodiment of a film stack 300$_i$ fabricated into a quartz phase shift mask 318 utilizing the method 200 described above. The subscript "i" is an integer representing different fabrication stages the film stack shown in FIGS. 3A-G.

Figure 3A:
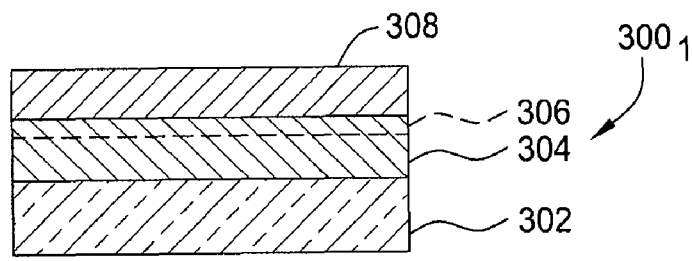
FIGS. 3A-G are one embodiment of quartz phase shift mask fabricated utilizing one embodiment of the quartz etch method of the present invention.

The film stack 300$_1$ depicted in FIG. 3A includes a quartz layer 302 having a photomask layer 304 disposed thereon. The photomask layer 304 is typically chromium or other suitable material such as those described above. An optional antireflection layer 306 (shown in phantom) may be disposed on the photomask layer 304. A first resist layer 308 is disposed on the photomask layer 304 or antireflection layer 306, when present.

Figure 3B:
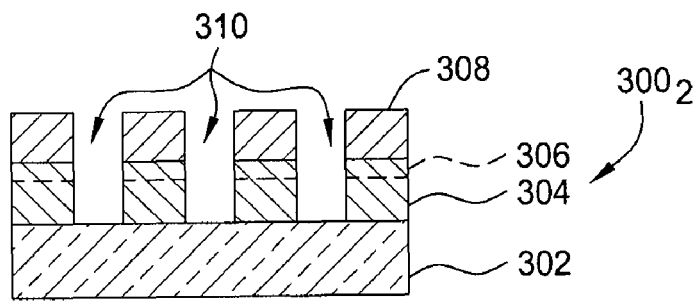
Figure 3C:
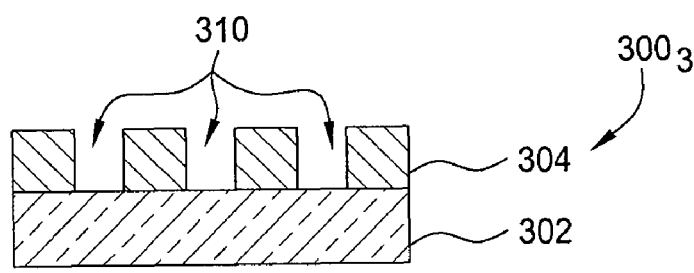

The first resist layer 308 is patterned and utilized as an etch mask to etch the photomask layer 304 to form features 310 exposing the underlying quartz layer 302 as depicted in FIG. 3B. The photomask layer 304 may be etched using a plasma formed from chlorine-containing gas (such as $Cl_2$) mixed with oxygen. One exemplary etch process is described in U.S. patent application Ser. No. 10/235,223, filed Sep. 4, 2002, which is incorporated herein by reference in its entirety. It is contemplated that other suitable metal etch processes may be utilized. After the features 310 are formed in the photomask layer 304, the remaining first resist layer 308 is removed, for example, by ashing, to leave the film stack 300$_3$ as shown in FIG. 3C.

Figure 3D:
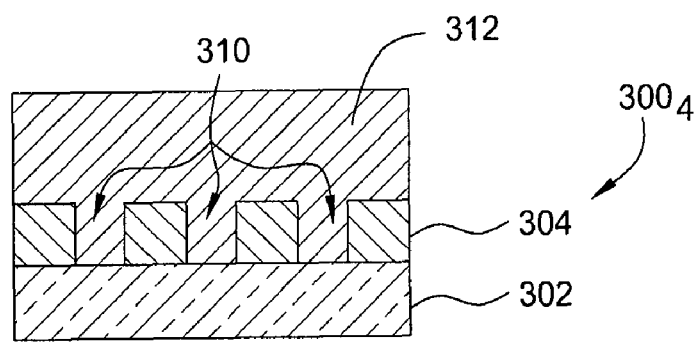
Figure 3E:
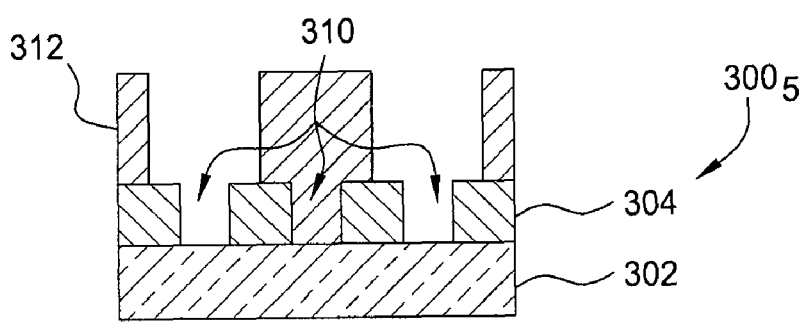

As shown in FIG. 3D, a second resist layer 312 is disposed on the film stack 300$_4$, filling the features 310. The second resist layer 312 is then patterned. Typically when forming a quartz phase shift mask, the patterned second resist layer 312 exposes the quartz layer 302 at the bottom of alternating features 310, as shown in FIG. 3E.

Figure 3F:
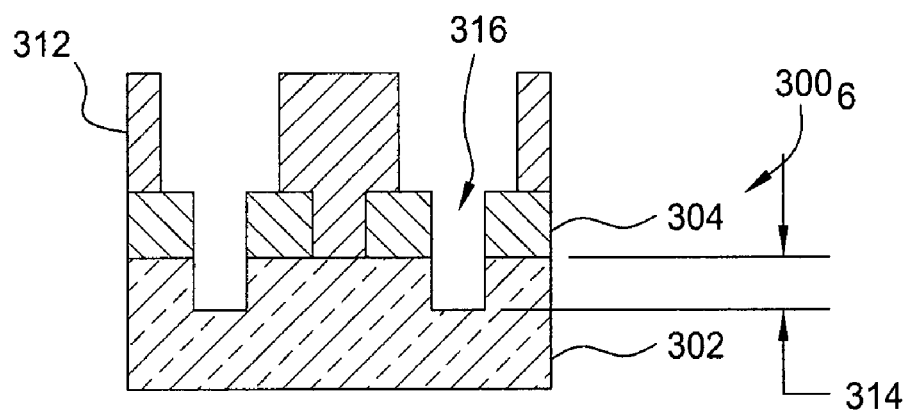
Figure 3G:
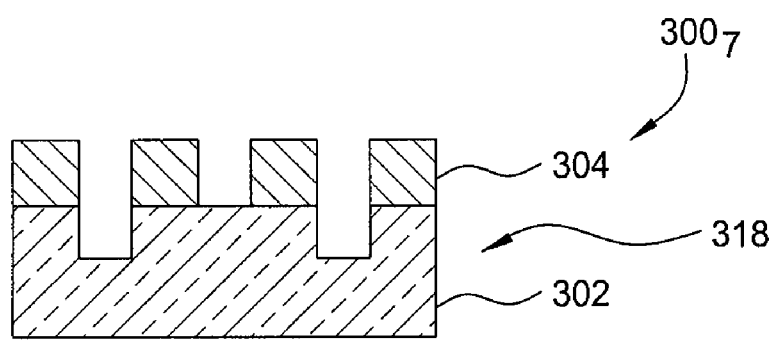

The quartz layer 302 exposed through the patterned second resist layer 312 is etched using the method 200 described above (e.g., a multi-step etching process is used as previously described and, in one embodiment, to obtained controlled uniformity for the etched feature). The endpoint of the quartz etch is selected such that a depth 314 of the etched quartz trench 316 shown in FIG. 3F is about equal to the length of 180 degrees phase shift through the quartz layer 302 for a predefined wavelength of light intended for use with the quartz phase shift mask 318. Typical wavelengths are 193 and 248 nm. Thus, the depth 314 is typically about either 172 or 240 nm, although other depths may be utilized for masks intended for use with different lithographic light wavelengths and/or manufacturing process flows. After the quartz trench 316 is etched, the remaining second resist layer 312 is removed, for example, by ashing, such that the remaining film stack 300$_7$ forms a quartz phase shift mask 318 as shown in FIG. 3G.

FIGS. 4A-E depict one embodiment of a film stack 400$_i$ fabricated into a chromeless etch lithography mask 418 utilizing the method 300 described above. The subscript "i" is an integer representing different fabrication stages the film stack shown in FIGS. 4A-E.

Figure 4A:
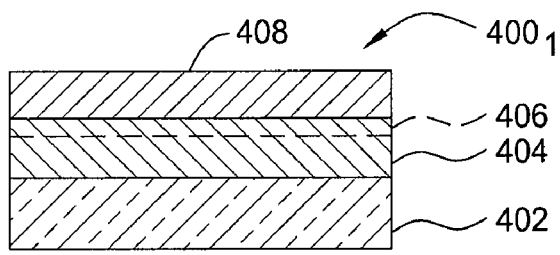
FIGS. 4A-E are one embodiment of quartz phase shift mask fabricated utilizing one embodiment of the quartz etch method of the present invention.

The film stack 400$_1$ depicted in FIG. 4A includes a quartz layer 402 having a mask layer 404 disposed thereon. The mask layer 404 is generally suitable for selectively etching quartz using fluorinated plasma chemistries, and in one embodiment is chromium or other photomask material. An optional antireflection layer 406 (shown in phantom) may be disposed on the mask layer 404. A resist layer 408 is disposed on the mask layer 404 or antireflection layer 406, when present.

Figure 4B:
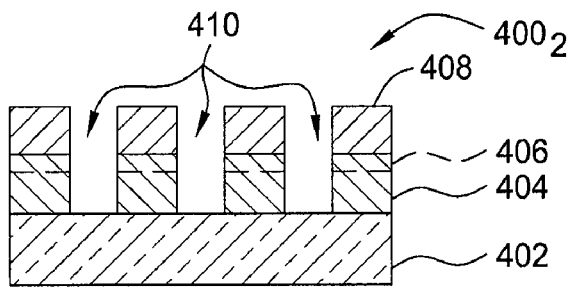
Figure 4C:
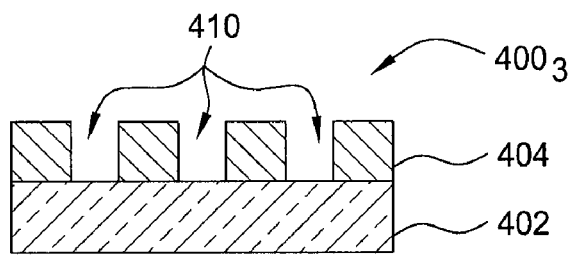

The resist layer 408 is patterned and utilized as a etch mask to etch the mask layer 404 to form features 410 exposing the underlying quartz layer 402 as depicted in FIG. 4B. The mask layer 404 may be etched using a plasma formed from chlorine-containing gases as described above. After the features 410 are formed in the mask layer 404, the remaining resist layer 408 is removed, for example, by ashing, to leave the film stack 400$_3$ shown in FIG. 4C. Optionally, the resist layer 408 may remain on the mask layer 404 and removed through erosion and/or stripping during subsequent processing.

Figure 4D:
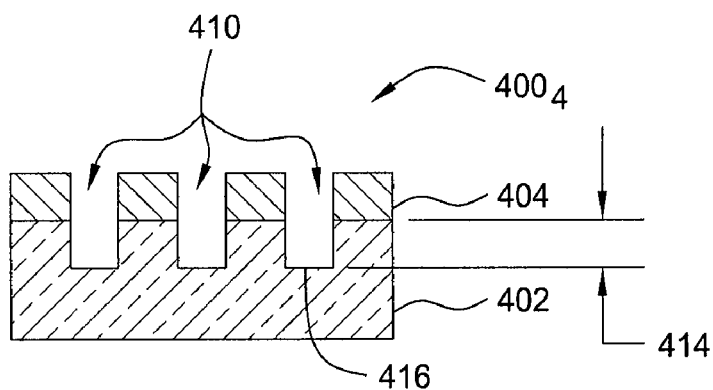
Figure 4E:
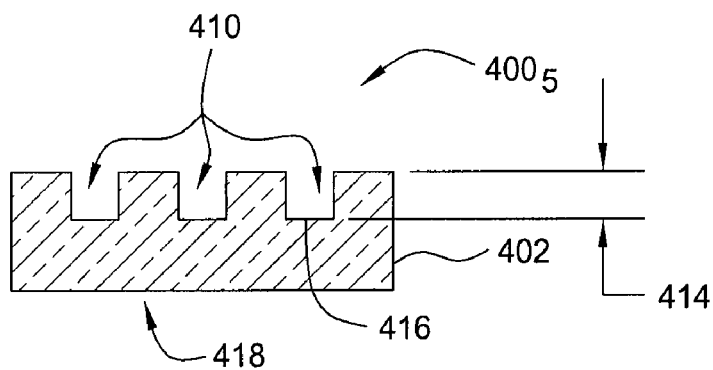

As shown in FIG. 4D, the quartz layer 402 exposed through the mask layer 404 at the bottom of the features 410 is etched using the method 200 described above (e.g., a multi-step etching process is used as previously described, and in one embodiment, to obtained controlled uniformity for the etched feature). The endpoint of the quartz etch is selected such that a depth 414 of the etched quartz trench 416 shown in FIG. 4D is about equal to the length of 180 degrees phase shift through the quartz layer 402 for a predefined wavelength of light intended for use with the chromeless etch lithography mask 418, e.g., the depth 414 is selected as described with reference to the mask 318 above.

After the quartz trench 416 is etched, the remaining portions of the mask layer 404 may optionally be removed. For example, the remaining portions of the mask layer 404 may be removed by selectively etching, for example, using chemistries utilized to pattern the mask layer 404. The quartz layer 402 remaining from the film stack $400_5$ forms a chromeless etch lithography mask 418 shown in FIG. 4E.

Thus, a method for etching quartz has been provided that advantageously improves trench attributes over conventional processes. Specifically, the method disclosed herein provides for greater uniformity and phase angle range as compared to conventional methods as well as providing reduced RIE lag, reduced microtrenching, and more vertical sidewall angle control as compared to conventional etch methods. Accordingly, the method of etching quartz described herein advantageously facilitates fabrication of phase shifting photomasks suitable for patterning features having sub-5 µm critical dimensions.

While the foregoing is directed to embodiments of the present invention, other and further embodiments of the invention may be devised without departing from the basic scope thereof, and the scope thereof is determined by the claims that follow.

The invention claimed is:

1. A method of etching quartz, comprising:
providing a film stack on a substrate support disposed in a processing chamber, the film stack having a quartz layer partially exposed through a patterned layer; and
etching the quartz layer of the film stack through the patterned layer in a multi-step process comprising:
a first step of etching the quartz layer utilizing a first process gas comprising at least one fluorocarbon process gas and a chlorine-containing process gas; and
a second step of etching the quartz layer utilizing a second process gas comprising at least one fluorocarbon process gas and no chlorine-containing process gas.

2. The method of claim 1, wherein the fluorocarbon process gas comprises at least one of $CF_4$, $CHF_3$, $C_2F$, $C_4F_6$, or $C_4F_8$.

3. The method of claim 1, wherein the fluorocarbon process gas comprises $CF_4$ and $CHF_3$.

4. The method of claim 1, wherein one or both of the first or the second step of etching further comprises:
flowing about 2 to about 50 sccm of $CF_4$ into the processing chamber; and
flowing about 2 to about 50 sccm of $CHF_3$ into the processing chamber.

5. The method of claim 1, wherein the first step of etching further comprises:
flowing at least one of $Cl_2$ or HCl into the processing chamber.

6. The method of claim 1, wherein the first step of etching further comprises:
flowing $Cl_2$ into the processing chamber.

7. The method of claim 1, wherein the first step of etching further comprises:
flowing about 1 to about 10 sccm of $Cl_2$ into the processing chamber.

8. The method of claim 1, further comprising repeating at least one step of the multi-step process.

9. The method of claim 1, further comprising repeating both steps of the multi-step process.

10. The method of claim 1, further comprising the step:
biasing the quartz layer with a plurality of power pulses less than 150 Watts in at least one of the steps of the multi-step process.

11. The method of claim 10, wherein the step of biasing further comprises:
pulsing power at a pulse frequency between about 1 to about 10 kHz.

12. The method of claim 10, wherein the patterned layer is not photoresist and wherein the step of biasing comprises:
pulsing power with a duty cycle between about 10 to about 50 percent.

13. The method of claim 10, wherein the patterned layer includes photoresist and wherein the step of biasing comprises:
pulsing power with a duty cycle between about 10 to about 90 percent.

14. A method of forming a photomask, comprising:
a) patterning a mask layer on a quartz layer disposed on a substrate support in a processing chamber;
b) etching the quartz layer of the film stack through the mask layer in a multi-step process comprising:
a first step of etching the quartz layer utilizing at least one fluorocarbon process gas and a chlorine-containing process gas; and
a second step of etching the quartz layer utilizing at least one fluorocarbon process gas and no chlorine-containing process gas;
c) terminating each step of etching of the quartz layer at a predefined etch depth; and
d) removing the mask layer after etching the quartz layer in the multi-step process.

15. The method of claim 14, further comprising the step of:
biasing the quartz layer with a plurality of power pulses of less than 150 Watts in at least one of the steps of the multi-step process.

16. The method of claim 14, further comprising repeating at least one step of the multi-step process.

17. The method of claim 14, further comprising repeating both steps of the multi-step process.

18. The method of claim 14, wherein the first step of etching further comprises:
flowing $Cl_2$ into the processing chamber.

19. The method of claim 14, wherein the first step of etching further comprises:
flowing $CF_4$ and $CHF_3$ into the processing chamber.

20. The method of claim 14, wherein the step of patterning a mask comprises:
patterning a layer of resist on the mask layer, wherein the mask layer comprises chromium;
etching the chromium mask layer to form openings therethrough; and
removing the layer of resist from the chromium mask layer.

21. The method of claim 14, wherein the step of patterning a mask comprises:
patterning a first layer of resist on an opaque light-shielding layer of metal;
etching the light-shielding layer of metal to form at least a first opening and a second opening therethrough; and patterning a second layer of resist on an opaque light-shielding layer of metal to form the mask layer, wherein the first opening in the light-shielding layer of metal remains filled with the second layer of resist after patterning.

22. A method of forming a photomask, comprising:
a) patterning a first layer of resist on a chromium layer;
b) etching the chromium layer to form at least a first opening and a second opening therethrough;
c) removing the first layer of resist;
d) patterning a second layer of resist on the chromium layer, wherein the first opening in the chromium layer remains filled with the second layer of resist after patterning; and
e) etching portions of a quartz layer exposed through the chromium layer to a depth one half a photolithography light wavelength of between about 193 to about 248 nm using a multi-step etch process comprising:
a first step of etching the quartz layer utilizing at least one fluorocarbon process gas and a chlorine-containing process gas; and
a second step of etching the quartz layer utilizing at least one fluorocarbon process gas and no chlorine-containing process gas.

23. The method of claim 22, wherein at least one of the first or the second step of etching further comprises:
flowing $CF_4$ and $CHF_3$ into the processing chamber.

24. The method of claim 22, wherein the first step of etching further comprises:
flowing $Cl_2$ into the processing chamber.

25. The method of claim 22, further comprising the step of:
biasing the quartz layer with a plurality of power pulses of less than 150 Watts in at least one of the steps of the multi-step process.

26. The method of claim 22, wherein one or both of the first or the second step of etching further comprises:
applying bias power of less than about 150 Watts at a duty cycle between about 10 to about 90 percent;
inductively coupling the less than about 600 Watts of RF power to an antenna disposed proximate the process chamber;
flowing less than about 15 sccm of $CF_4$ into the processing chamber; and
flowing less than about 30 sccm of $CHF_3$ into the processing chamber.

27. The method of claim 22, wherein the first step of etching the quartz layer further comprises:
applying bias power of less than about 150 Watts at a duty cycle between about 10 to about 90 percent;
inductively coupling the less than about 600 Watts of RF power to an antenna disposed proximate the process chamber; and
flowing less than about 10 sccm of $Cl_2$ into the processing chamber.

28. The method of claim 22, further comprising repeating at least one step of the multi-step process.

29. The method of claim 22, further comprising repeating both steps of the multi-step process.

* * * * *